United States Patent [19]

Swanson

[11] Patent Number: 4,611,130
[45] Date of Patent: Sep. 9, 1986

[54] FLOATING INPUT COMPARATOR WITH PRECHARGING OF INPUT PARASITIC CAPACITORS

[75] Inventor: Eric J. Swanson, Reading, Pa.

[73] Assignee: AT&T Bell Laboratories, Murray Hill, N.J.

[21] Appl. No.: 579,772

[22] Filed: Feb. 13, 1984

[51] Int. Cl.[4] .......................... H03K 5/24; H03K 17/16
[52] U.S. Cl. .................................. 307/355; 307/200 B; 307/246; 307/353; 307/494; 307/577; 307/579; 328/147
[58] Field of Search ............... 307/200 A, 200 B, 491, 307/494, 496–498, 350, 530, 352–353, 355, 246, 571, 572, 577, 579, 584–585; 328/116, 147

[56] References Cited

U.S. PATENT DOCUMENTS

| | | | |
|---|---|---|---|
| 4,124,806 | 11/1978 | Rusznyak | 307/246 X |
| 4,211,939 | 7/1980 | Furman | 307/497 |
| 4,214,175 | 7/1980 | Chan | 307/350 X |
| 4,274,013 | 6/1981 | Clemons et al. | 307/530 |
| 4,412,143 | 10/1983 | Patella et al. | 307/530 |
| 4,521,703 | 6/1985 | Dingwall | 307/530 |

Primary Examiner—Stanley D. Miller
Assistant Examiner—D. R. Hudspeth
Attorney, Agent, or Firm—Wendy W. Koba

[57] ABSTRACT

The present invention relates to a floating input comparator capable of mitigating the effects of parasitic capacitance present at the input stage of the comparator. In particular, the present invention functions to substantially reduce the effects of parasitic capacitive voltage division present at the nodes interrogated during each detection cycle. In accordance with the present invention, precharging devices (40, 42, 44) are coupled between a predetermined reference potential (VDD) and the affected nodes (D, E, C) to precharge the nodes to the full reference potential prior to each detection cycle, thereby eliminating the effects of a changing, unknown parasitic capacitance at these nodes by replacing an unknown parasitic potential with the known reference potential.

11 Claims, 4 Drawing Figures

FIG.-3
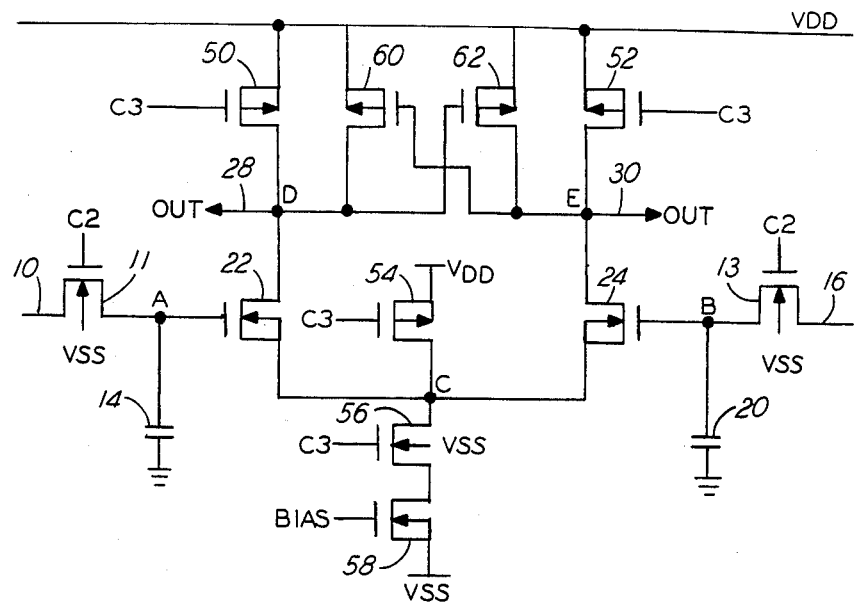
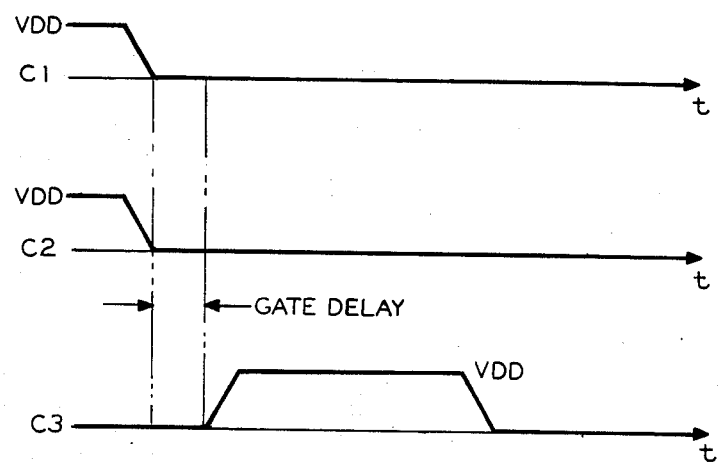
FIG.-4

4,611,130

FLOATING INPUT COMPARATOR WITH PRECHARGING OF INPUT PARASITIC CAPACITORS

BACKGROUND OF THE INVENTION

1. Field of the Invention

The present invention relates to an improved floating input comparator and, more particularly, to a floating input comparator capable of mitigating the effects of parasitic capacitance.

2. Description of the Prior Art

Floating input comparators are useful in general applications where comparator analog inputs are not valid for a full detection cycle or where one comparator input must be held for several detection cycles. In form, comparators are high gain, uncompensated differential amplifiers, where input stage capacitances (referred to as parasitic capacitances) couple a portion of the associated gain back to the input.

One exemplary CMOS comparator is disclosed in U.S. Pat. No. 4,075,509 issued to T. P. Redfern on Feb. 21, 1978. Here, a novel mask geometry is provided for the gate electrode such that the total source/drain area under the gate remains the same regardless of the alignment of the mask within a certain predetermined tolerance. The effects of parasitic capacitance in the Redfern arrangement are minimized by the inclusion of a dummy transistor in the first stage amplifier.

The effects of parasitic capacitance may, in some cases, be compensated by the use of an array of switchable resistors, as disclosed in U.S. Pat. No. 4,301,419 issued to T. J. Calomiris on Nov. 17, 1981. While such an arrangement is useful in many cases, for example, to maintain a relatively constant Q and gain in a CMOS switched active filter, its use in association with a comparator circuit is ineffective.

Various other prior art methods exist for overcoming the problems associated with parasitic capacitance. For example, source-follower arrangements may be utilized to help negate the effects of the parasitics. Most notably, cascode arrangements are often employed. However, cascoding techniques merely reduce, not eliminate, the effects of parasitic capacitance.

The presence of any parasitic capacitance in a comparator circuit which utilizes floating inputs is especially harmful, since any stray capacitance may significantly alter the input values and cause the compartor to operate erroneously. Thus, there remains to be solved the problem of substantially eliminating the effects of parasitic capacitance on the operation of floating input comparators.

SUMMARY OF THE INVENTION

The present invention relates to an improved CMOS floating input comparator and, more particularly, to a floating input comparator capable of essentially eliminating the effects of parasitic capacitance.

It is an aspect of the present invention to eliminate the effects of parasitic capacitance by charging the nodes affected by this type of capacitance to a predetermined reference potential prior to the performance of each detection cycle.

Another aspect of the present invention is to eliminate the effects of parasitic capacitance without requiring the addition of an extensive number of circuit elements. In accordance with the present invention, a maximum number of three switching transistors coupled between VDD and the affected nodes are capable of eliminating the effects of parasitic capacitance.

Other and further aspects of the present invention will become apparent during the course of the following discussion and by reference to the accompanying drawings.

BRIEF DESCRIPTION OF THE DRAWING

Referring now to the drawings, where like numerals represent like parts in several views:

FIG. 3 contains a detailed illustration of the input stage of a CMOS floating input comparator formed in accordance with the present invention; and FIG. 4 contains a diagram of the various clock waveforms associated with the exemplary floating input comparator arrangement of FIG. 3.

DETAILED DESCRIPTION

Figure 1:
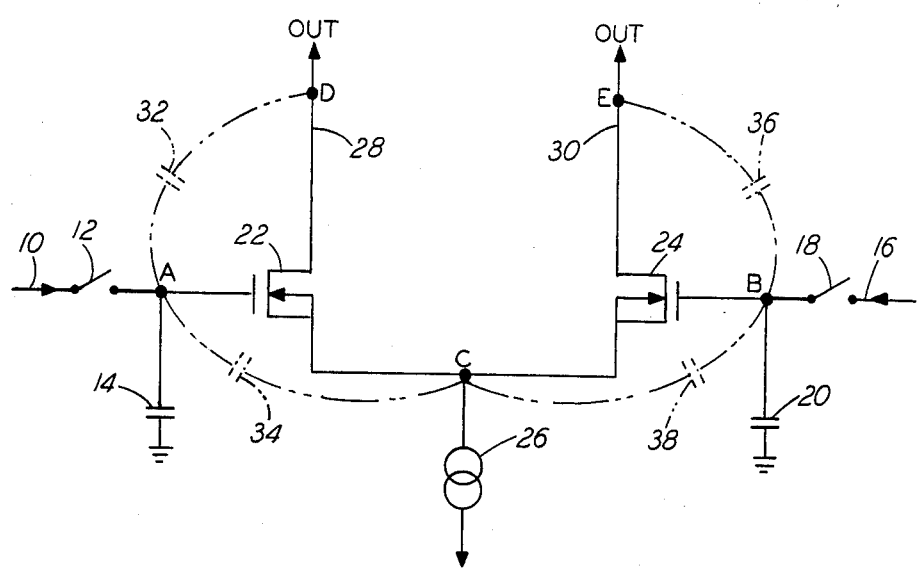
FIG. 1 illustrates the input stage of a prior art floating input comparator, where the existence of the parasitic capacitance is illustrated by dotted lines.

The input stage of a prior art floating input comparator is illustrated in FIG. 1. In operation, the signal existing at input line 10 is transferred via a switch 12 to a storage capacitor 14 during a first read cycle. Similarly, during the same, or a subsequent, read cycle, the signal existing at input line 16 is transferred via a switch 18 to a storage capacitor 20. At the completion of each read cycle, switches 12 and/or 18 are opened, isolating input lines 10 and 16 from storage capacitors 14 and 20, respectively, and the detection cycle is initiated.

As shown in FIG. 1, the detection cycle is initiated by the operation of a pair of source-coupled transistors 22 and 24, which are coupled to storage capacitors 14 and 20, respectively. In particular, the gate of transistor 22 is coupled to storage capacitor 14 and the gate of transistor 24 is coupled to storage capacitor 20. The source leads of transistors 22 and 24 are coupled to a bias current source 26. Source-coupled transistors 22 and 24 amplify and transfer the differential voltage on storage capacitors 14 and 20 to output lines 28 and 30, respectively.

The dotted lines in FIG. 1 illustrate the parasitic gate-to-source and gate-to-drain capacitance which exists in association with both transistors 22 and 24, where parasitic capacitors 32 and 34 are associated with transistor 22 and parasitic capacitors 36 and 38 are associated with transistor 24. The presence of this parasitic capacitance allows the voltages at nodes D and E, associated with output lines 28 and 30, respectively, to feed back to the floating input nodes A and B. This feedback thus corrupts the voltages present at nodes A and B by a value dependent on the comparator decision. In particular, since storage capacitor 14 and parasitic capacitors 32 and 34 share a common node A, capacitive voltage division will occur, thereby changing the stored voltage transferred to the remainder of the floating input comparator circuit. The results of one comparator decision can thus influence future comparator decisions. In a similar manner, capacitive voltage division will occur at node B, the common node of storage capacitor 20 and parasitic capacitors 36 and 38.

Since the transconductance properties of transistors 22 and 24 are of primary concern in a comparator arrangement, these devices are, of necessity, rather large. It is well known that as the size of these devices increase, the parasitic capacitance associated therewith also increases to the point where, for example, the values of parasitic capacitors 32 and 34 become appreciable fractions of the value of storage capacitor 14. Thus, the existence of parasitic capacitance in the input stage of a floating input comparator presents a serious problem which greatly affects the ability of the comparator to consistently produce accurate results.

Figure 2:
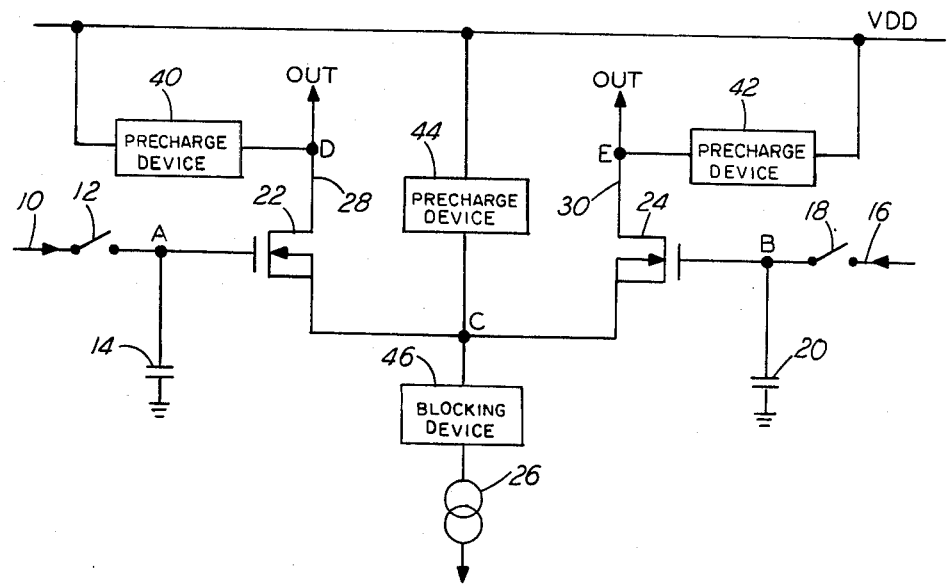
FIG. 2 illustrates, in block diagram form, the input stage of a floating input comparator formed in accordance with the present invention.

The solution to the problem of parasitic capacitance as disclosed in the present invention is illustrated in simplified form in FIG. 2. The circuit of FIG. 2 is essentially identical to that of FIG. 1, with the inclusion of a plurality of precharging devices 40, 42, and 44 disposed between a predetermined reference potential, here denoted VDD, and nodes D, E, and C, respectively. In operation of the floating input comparator formed in accordance with the present invention, the read cycle begins with the closing of switches 12 and/or 18 and the passing of the input signals from lines 10 and 16 to storage capacitors 14 and 20, respectively, in a manner similar to that described above in association with the operation of a prior art comparator circuit. Likewise, the end of the read cycle is signified by the re-opening of switches 12 and/or 18.

In contrast to the previsously described prior art comparator procedure, prior to the initiation of the detection cycle, precharge devices 40, 42 and 44 included in the present invention are activated, thereby precharging nodes D, E, and C to a known voltage level. As shown, precharge devices 40, 42, and 44 may simply be connected to VDD, charging nodes D, E, and C to the positive supply voltage prior to detection. A current blocking device 46 is disposed between node C and bias current source 26. Prior to detection, current blocking device 46 functions to disconnect current source 26 from node C, thereby allowing precharging device 44 to bring node C to the full VDD potential without any competition from current source 26. In accordance with the present invention precharging occurs prior to each detection cycle. Therefore, the change in voltage stored in capacitors 14 and 20 is only a function of the change in input voltage at input lines 10 and 16, respectively. Thus, effects of an unknown and variable amount of parasitic capacitance are eliminated by the coupling of a known voltage, here VDD, to the affected nodes D, E, and C. The presence of parasitic capacitors 32, 34, 36 and 38 is totally subsumed by the presence of the known voltage, VDD, and nodes A and B are maintained at their respective voltage levels at the beginning of each read cycle.

A more detailed circuit diagram of the input stage of a CMOS floating input comparator formed in accordance with the present invention is illustrated in FIG. 3, where the associated clocking signals are shown in FIG. 4. Referring to FIG. 3, switches 12 and 18 are formed by a pair of CMOS transistors 11 and 13, respectively. Transistors 11 and 13 are activated to connect input lines 10 and 16 to storage capacitors 14 and 20 by two separate clock signals, denoted C1 and C2 in FIGS. 3 and 4. It is to be noted that in operation of a floating input comparator in accordance with the present invention, either, neither, or both of the input lines 10 and 16 need be accessed during a particular read cycle. If a particular input is not accessed, the information on the associated storage capacitor is not updated and the old value is employed during the detection cycle. As seen by reference to FIG. 4, at the completion of the read cycle, clock signals C1 and/or C2, depending upon whether an update occurs, again go low turning off transistors 11 and 13, isolating input lines 10 and 16 from the remainder of the comparator circuit.

Charging devices 40, 42, and 44 comprise, in the exemplary arrangement of FIG. 3, a plurality of MOS transistors. As shown, p-channel MOS transistors 50, 52, and 54 are coupled between VDD and nodes D, E, and C, respectively. In particular, the source leads of transistors 50, 52, and 54 are all connected to VDD and the gate of each device is activated by a clock signal C3. The drain of transistor 50 is coupled to node D, the drain of transistor 52 is coupled to node E, and in a similar manner, the drain of transistor 54 is coupled to node C. In the exemplary arrangement of FIG. 3, current blocking device 46 comprises an n-channel MOS transistor 56 and bias current source 26 comprises an n-channel MOS transistor 58 coupled to a VSS voltage source. As shown, the drain of transistor 56, like the drain of transistor 54, is coupled to node C. The gate of transistor 56 is activated by the same clock signal, C3, as transistors 50, 52, and 54. The source of transistor 56 is coupled to the drain of transistor 58 and the source of transistor 58 is, as stated above, connected to VSS. The gate of transistor 58 is connected to a BIAS signal source (not shown) which controls the amount of current produced by current source 26. Since transistor 56 is a p-channel device and transistor 50, 52 and 54 are n-channel devices, transistor 56 will be conducting during the detection cycle while transistors 50, 52, and 54 will not be conducting. During the precharge cycle, however, clock signal C3 will deactivate transistor 56 and activate transistors 50, 52, and 54 so that they will begin conducting. The deactivation of transistor 56 thus disconnects transistor 58 from the rest of the circuit, cutting off the current flow to node C, for the reasons stated above.

The charging cycle, which occurs during the read cycle and before the detection cycle, is controlled by a clock signal C3, illustrated in FIG. 4. When clock signal C3 is low, transistors 50, and 52, and 54 are activated and the VDD line is directly connected to nodes D, E, and C. At the end of the charging cycle, there is a delay associated with the deactivation of transistor 50, 52, and 54 and the activation of transistor 56, to insure that transistors 11 and 13 are turned off before detection starts. As shown in FIG. 3, pair of cross-coupled transistors 60 and 62 are connected between VDD and nodes D and E to latch up these nodes at a fast rate. As such, transistors 60 and 62 are not necessary to the performance of a comparator circuit in accordance with the present invention. In fact, any load circuit capable of providing differential current to voltage conversion may be used in association with the present invention. With nodes D, E, and C at the full VDD potential, the detection cycle is initiated, and the comparator output voltage develops between output lines 28 and 30.

What is claimed is:

1. A floating input comparator for receiving a pair of input signals along a pair of associated input lines and producing as an output a pair of differential output signals along a pair of output lines, said floating input comparator comprising a pair of storage means, each storage means of said pair of storage means switchably connected to a separate one of said pair of input lines and capable of storing a separate one of said pair of input signals;

a pair of differential amplifying devices, each amplifying device of said pair of amplifying devices connected between a separate one of said pair of storage means and a separate one of said pair of output lines, said pair of differential amplifying devices for producing as an output said pair of differential output signals;

a bias current source connected to each each differential amplifying device of said pair of differential amplifying devices at a common node;

a plurality of parasitic capacitors associated with each storage means of said pair of storage means; and precharging means coupled between a predetermined reference potential and each output line of said pair of output lines and also coupled between said predetermined reference potential and said common node, for precharging said pair of output lines and said common node to said predetermined reference potential prior to the production of said pair of differential output signals by said pair of differential amplifying means.

2. A floating input comparator in accordance with claim 1 wherein each storage means comprises a storage capacitor.

3. A floating input comparator formed in accordance with claim 1 wherein the predetermined reference potential is a power supply of said floating input comparator.

4. A floating input comparator in accordance with claim 1 where the precharging means comprises a plurality of MOS transistors.

5. A floating input comparator in accordance with claim 1 wherein the precharging means comprises a first precharging device coupled between a first one of the pair of differential amplifying devices and the predetermined reference potential;

a second precharging device coupled between a second one of said pair of differential amplifying devices and said predetermined reference potential; and a third precharging device coupled between said predetermined reference potential and the common node of said pair of differential amplifying devices.

6. A floating input comparator in accordance with claim 5 wherein each precharging device comprises an MOS transistor, the gate input of each MOS transistor responsive to an external precharging clock signal for turning on each MOS transistor and connecting the predetermined voltage reference potential to the pair of differential amplifying devices and the common node thereof.

7. A floating input comparator in accordance with claim 5 wherein the precharging means further comprises a current blocking device coupled between the bias current source and the common node of the pair of differential amplifying devices.

8. A floating input comparator in accordance with claim 7 wherein the current blocking device comprises an MOS transistor, the gate input of the MOS transistor responsive to an external precharging clock signal for turning off said MOS transistor and disconnecting the bias current source from the pair of differential amplifying means devices.

9. A floating input comparator in accordance with claim 1 wherein the comparator further comprises a pair of cross-coupled MOS transistors connected between the predetermined reference potential and the output of each differential amplifying device.

10. A floating input comparator formed in accordance with claim 1 wherein the first differential amplifying device comprises a first MOS transistor with its gate connected to a first storage means of the pair of storage means and its drain connected to a first output line of the pair of output lines, and the second differential amplifying device comprises a second MOS transistor with its gate connected to a second one of said pair of storage means and its drain connected to a second output line of said pair of output lines, the sources of said first and second MOS transistors connected together to from the common node connection to the bias current source.

11. A floating input comparator in accordance with claim 10 wherein the plurality of parasitic capacitors comprises a first gate-to-source capacitor coupled between the first storage means and the source of the first MOS amplifying transistor;

a second gate-to-source capacitor coupled between the second storage means and the source of the second MOS amplifying transistor, a first gate-to-drain capacitor coupled between the first storage means and the drain of the first MOS amplifying transistor, and a second gate-to-drain capacitor coupled between the second storage means and the drain of the second MOS amplifying transistor.

* * * * *